United States Patent [19]
Sauvinet et al.

[11] Patent Number: 5,304,394
[45] Date of Patent: Apr. 19, 1994

[54] TECHNIQUE FOR FORMING, BY PYROLYSIS IN A GASEOUS PROCESS, A COATING BASED ESSENTIALLY UPON OXYGEN AND SILICON

[75] Inventors: Vincent M. Sauvinet, Copenhague, Denmark; Jean-Francois M. Oudard, Compiegne, France

[73] Assignee: Saint-Gobain Vitrage International, Courbevoie, France

[21] Appl. No.: 897,782

[22] Filed: Jun. 12, 1992

[30] Foreign Application Priority Data

Jun. 14, 1991 [FR] France .................. 91 07284

[51] Int. Cl.$^5$ .................. B05D 5/06; C23C 16/00
[52] U.S. Cl. .................. 427/166; 427/167; 427/255; 427/255.1; 427/255.4; 427/255.5; 65/60.8
[58] Field of Search ........... 427/255, 255.1, 255.4, 427/255.5, 126.3, 166, 167; 65/60.8

[56] References Cited

U.S. PATENT DOCUMENTS 5,041,150 8/1991 Grundy et al. .................. 65/60.51

FOREIGN PATENT DOCUMENTS

| 0174727 | 3/1986 | European Pat. Off. . |
| 0305102 | 3/1989 | European Pat. Off. . |
| 2477131 | 4/1981 | France . |
| 1507996 | 4/1978 | United Kingdom . |
| 2184748A | 1/1987 | United Kingdom . |
| 9009883 | 4/1990 | World Int. Prop. O. . |

*Primary Examiner*—Shrive Beck
*Assistant Examiner*—David M. Maiorana
*Attorney, Agent, or Firm*—Oblon, Spivak, McClelland, Maier & Neustadt

[57] ABSTRACT

For forming by pyrolysis a coating based upon silicon, oxygen and carbon, on the surface of a moving glass substrates from a percursor gaseous mixture essentially without any oxidizing component and comprising a silane and an ethylenic compound, the contact time between this precursor mixture and the glass is maintained at a value greater than that necessary for the deposition of the coating if this were performed from a precursor gaseous mixture containing an oxidizing agent. The coating thus obtained has a refractive index lying between 1.45 and 2, preferably between 1.6 and 1.9, and its thickness reaches values greater than 50 mm.

7 Claims, 1 Drawing Sheet

TECHNIQUE FOR FORMING, BY PYROLYSIS IN A GASEOUS PROCESS, A COATING BASED ESSENTIALLY UPON OXYGEN AND SILICON

BACKGROUND OF THE INVENTION

1. Field of the Invention

This invention relates to a technique for the depositions by pyrolysis of a gaseous mixture, of a coating film based essentially upon oxygen, silicon and also carbon, onto the surface of a hot glass substrate. The invention further relates to the conditions in which such a deposition is carried out, a device used for this purpose, especially the nozzle that enables said gaseous mixture to be distributed and channeled, the thus coated substrate, and its applications to different types of glazing.

2. Description of the Related Art

Such techniques, using distribution nozzles for gases intended to decompose by pyrolysis on the surface of a glass ribbon, are already known, notably from French patent specification FR-2 314 152. This patent discloses a distribution nozzle placed inside the enclosure of a float bath, transversely to the axis of travel of the glass ribbon sliding over the surface of the molten metal bath. The gaseous flow emitted by the injection device of the nozzle is guided along a channel having a U section, defined by the walls of a central block flanked by "front" and "rear" heels (as defined in relation to the axis of travel of the ribbon). In this way, the gas stream undergoes a laminar flow travel over the surface of the glass parallel to this axis, during the course of which travel the pyrolysis of "precursor" gaseous elements participating in this flow takes place. Then, the thus depleted gaseous stream is removed by a suction device disposed at the outlet of the channel.

French Patent Application No. 91-01683 proposes a type of nozzle that enables the circulation of the gas stream on the surface of the glass to be optimized in order to improve the efficiency of the pyrolysis reaction, by modifying, notably, the configuration of the previously mentioned channel, notably by raising one of the heels and providing secondary suction devices.

To perform the deposition within the enclosure of the float bath requires that the gas pyrolysis device be placed inside this enclosure, generally in its "downstream part", i.e., when the glass ribbon has already acquired its dimensional stability, and this offers several technical advantages:

First of all, the glass ribbon has a temperature which is accurately known and managed throughout the length of th float bath, which ensures at the position of the pyrolysis device a glass temperature that is virtually constant and suitable for the decomposition of the gases commonly used, or in the region of 700° C. In this way it becomes unnecessary to have recourse, as is frequently the case when the device is located outside the enclosure, to a reheating operation for the glass.

Furthermore, if it in intended to deposit different coating films in succession on the glass ribbon, by a plurality of pyrolysis reactions for instance, it is frequently of some advantage to be able to perform the first deposition within the float enclosure. It is thereby possible to reduce the total space requirement for the equipment in later depositions, which equipment is usually disposed between the outlet from the float bath for the glass ribbon and its entry into the annealing chamber, i.e., an oven making possible, by control of the temperature reduction, a relief of the internal stresses in the glass.

When an attempt is made, however, to apply this type of technology inside the float enclosure to the deposition of a film based upon oxygen, silicon and possibly also carbon, and the thickness of which is significant, a problem is encountered, as the state of the art demonstrates:

Thus, the patents EP-174 727 and GB-2 199 848 both propose a process for producing this type of coating in such conditions. The first document uses as "precursor" gases, that in to say gas capable of participating in the pyrolysis, a mixture consisting of a silane constituting the source of silicon and of an electron donor compound such as an ethylenic compound. If carbon dioxide is also mentioned, it is nevertheless described that it in better to avoid the use of this type of external oxygen source.

In fact, according to the above document, the sole source of oxygen that is capable of being associated with the silicon atoms arising from the decomposition of the silane is the glass itself, a certain proportion of the oxygen atoms of which would be capable of diffusing to the surface, a phenomenon that is made easier by the possible adsorption of the electron donor to said surface of the glass. According to this teaching, this capacity for diffusion is very limited, which leads to the obtaining of films of very modest thicknesses, less than 50 nm. This is why the application of these films is confined to the blocking of ion migrations. However, these thicknesses can be judged clearly inadequate for acting in an interferential manner and significantly upon the colored appearance in reflection of a substrate later provided with a functional second film, which is a very important field of application.

The second document proposes, in contrast, for the purpose of producing the same class of coating, to add to the already mentioned "precursor" gas a supplementary compound considered to fulfill the function of a source of "make-up" oxygen, such as carbon dioxide, the latter being used in a very high proportion relative to the silane. A coating having a thickness which can be as high an 80 nm is then obtained. However, the introduction of such a large quantity of an oxidizing component into a float glass enclosure leads to a high risk of perturbing the atmosphere in the latter, which has, by the well controlled proportions of hydrogen and nitrogen, a reducing character suitable for preventing any oxidation of the molten metal bath.

SUMMARY OF THE INVENTION

It is an object of the present invention to overcome the disadvantages mentioned above by providing a pyrolysis technique by gaseous process, which makes it possible both to operate inside the float enclosure without perturbing its atmosphere, and also to obtain a coating based upon silicon, oxygen and possibly carbon, the global refractive index of which may be less than 2 and the thickness of which may be considerably greater than 50 nm.

To achieve this object, the contact time is optimized between the precursor gases and the glass during the laminar flow of the gases previously referred to and defined by the part of the guiding channel which may be designated under the term "deposition zone", and without having recourse to the oxidizing component.

This optimization is not carried out solely by taking into account the diffusion time of the precursor gases from the ceiling of the guidance channel to the surface of the glass, as is the usual practice in the relatively empirical calculations explained below, which calculations lead to "translating" in some way this necessary diffusion time into length of deposition zone, taking account of the various parameters for the deposition.

In contrast, this invention is based upon the hypothesis, even though the mechanism of this phenomenon is still not well explained, that the sole source of oxygen arises from the glass itself. Thus, the contact time is no longer defined as a function of the diffusion of the precursor gases, but as a function of the diffusion of the oxygen contained in the glass to the surface of that glass. Therefore, using only a silane and an ethylene compound, it has been found, surprisingly, that by increasing the contact time between precursor gases and glass it is possible to "amplify" this diffusion of oxygen through the thickness of the glass.

By guaranteeing sufficient minimum proportions of silane and ethylene, there is then obtained according to this invention the desired coating based upon oxygen, silicon and carbon and having the desired refractive index and a thickness very clearly greater than 50 nm, without having to make use of any supplementary oxygen source.

The present invention therefore runs counter to the teaching of the state of the art, because it "extracts" from the glass a sufficient quantity of oxygen, this oxygen becoming associated, at the surface of the glass, with the silicon and the carbon to create a coating having a thickness exceeding 50 nm. Thus it is not enough to guarantee "minimum contact time" between the precursor gases and the glass so as to allow these precursor gases to reach the glass by diffusion, nor to guarantee a sufficient quantity of precursor gases, in order to obtain a coating having the desired thickness. Instead, it is necessary to take into account this phenomenon of diffusion-incorporation into the coating of the oxygen atoms and, in order to achieve this, to go well beyond the minimum contact time.

The invention therefore provides a technique for forming, by pyrolysis in a gaseous process, a coating having an interferential function, based upon silicon, oxygen and carbon, on the surface of a moving glass substrate, from a precursor gaseous mixture essentially deprived of oxidizing component and comprising a silane and an ethylenic compound, in such a way that the contact time between this precursor mixture and the glass is maintained at a value greater than the contact time necessary for the deposition of said coating if this were performed from a precursor gaseous mixture containing an oxidizing agent. The coating thus obtained has a refractive index lying between 1.45 and 2, preferably between 1.6 and 1.9, and its thickness reaches values greater than 50 nm.

Various parameters may be involved in controlling this contact time.

According to the invention, the length of the deposition zone, and also the speed of the glass substrate as it moves, are adapted to the above phenomenon.

Surprisingly it has been found that, by jointly adapting these two parameters, notably in such a way that the length of the deposition zone, expressed in meters, is greater than or equal to 1.5 times the speed of the substrate; itself expressed as meters per second, the coating obtained may have a thickness very clearly greater than 50 nm.

Thus, if a length of deposition zone lying between 0.2 and 0.4 m in chosen, together with a substrate speed lying between 0.1 and 0.2 m/s, coatings having thicknesses of at least 50 nm and up to 90 nm and more are obtained.

A major advantage of the invention resides in the fact that it is possible to obtain this type of coating by this technique of deposition above the glass ribbon while it is at a temperature of approximately 700° C., in the float enclosure, without risk of adversely affecting its reducing atmosphere. But it is self-evident that such a technique may also be used outside this enclosure.

BRIEF DESCRIPTION OF THE DRAWING

The advantageous details and characteristics of the invention will now become apparent from the following non-limiting examples, illustrated by FIG. 1, which shows the distribution nozzle in cross-section of a pyrolysis device used in the technique of deposition by gaseous pyrolysis according to this invention.

DETAILED DESCRIPTION OF THE PREFERRED EMBODIMENT

Figure 1:
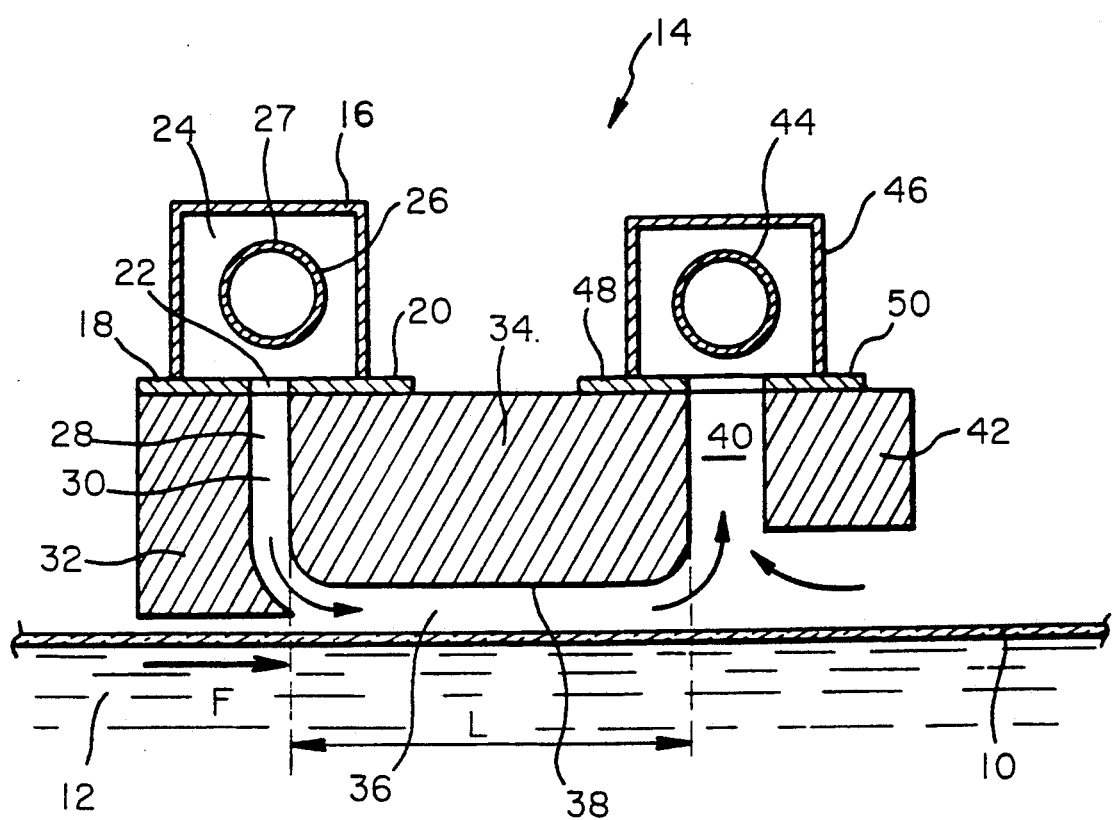

It should be stated first of all that it would be possible to refer, for a detailed description of the whole arrangement of a pyrolysis device for gaseous compounds, to the patents mentioned earlier. The following description will be limited to the elements of the distribution nozzle that are indispensable for an understanding of the invention. The proportions of the various elements shown have not been followed with accuracy, in order to make the figure clearer.

FIG. 1 shows the distribution nozzle of a pyrolysis device inside a float glass enclosure, not shown. A glass ribbon 10 floats on the surface of a bath of metal 12, usually formed of molten tin, inside an enclosure, not shown, containing the tin bath. The glass is poured onto the molten bath from a glass melting furnace, also not shown, situated to the left of FIG. 1, and spreads out to form a ribbon which is removed from the bath at a constant speed in the direction of arrow f by extractor means mounted at the outlet from the bath, to the right side of the figure.

Above the glass ribbon 10, which has a width of approximately 3.30 m in a zone of the float bath where the glass ribbon has acquired dimensional stability, there is mounted a nozzle 14 for the supply of a coating gas. The nozzle is disposed transversely to the glass ribbon. It comprises a profiled member 16 having the cross-section of an inverted U, of which the edges of the walls are fixed to horizontal brackets 18, 20. These brackets define between them an aperture 22, transverse to the ribbon.

In the chamber 24 defined by the profiled member there is housed a gas feed duct 26, perforated throughout its length by holes 27. The gas expands to fill the chamber 24, where it becomes established at a uniform pressure and flows through the opening 22 towards a guide channel 28 of U-section. This channel 28 comprises a vertical injection chamber 30 defined between an upstream profiled heel 32 and a central profiled block 34, a horizontal chamber 36 of constant thickness, comprised between the glass band 10 and the flat lower face 38 of the central block and a vertical suction chamber 40, defined between the central block and a profiled downstream heel 42.

This horizontal chamber 36 defines the laminar path of the precursor mixture over the surface of the glass, parallel to the axis of travel of the glass. Its height is preferably from 3 to 6 mm.

At the outlet from the chamber 40, the gas is sucked by a transverse suction duct 44, housed in a profiled member 46 of inverted U-section, fixed onto the central block and onto the downstream heel 42 by means of brackets 48, 50.

Within the framework of this inventions it is therefore necessary to adapt the contact time between precursor and glass, notably by causing different conditions of the deposition process to vary. In the following examples, apart from the variations in composition of the gases, we have also varied the length L of the deposition zone of the horizontal chamber 36, which corresponds to the portion of the path of the gas flow parallel to the axis of travel of the glass ribbon, and also the speed of the glass ribbon. This length L is, in fact, approximately the length of the lower face 38 of the central block, as the figure shows. The width of this chamber is, in all the following examples, approximately 3.20 m; a value corresponding approximately to the "useful" width of the ribbon after edge trimming outside the float enclosure.

This adaptation of the pyrolysis device according to the invention is clearly applicable to all types of conventional nozzles, and is in no way limited to that shown here.

EXAMPLES 1 TO 7

Various depositions of silicon oxycarbide were carried out in the following Examples 1 to 7 with the above type of nozzle. Examples 1 to 5 relate to the coating of a ribbon of clear silico-sodo-calcic glass of 4 mm thickness. The last two examples relate to the coating of a similar ribbon of glass, but in this case 8 mm in thickness.

For each of the examples the deposition conditions are: the flow rates Q of the gases involved in the pyrolysis, that is, monosilane $SiH_4$, ethylene $C_2H_4$ and the inert carrier gas nitrogen $N_2$, are volumetric flow rates expressed in liters/minute. The ratio of the flow rate of the ethylene to that of the monosilane lies between 4 and 10 and is preferably 7.

The velocity v of the glass ribbon is expressed in meters/second and the length L of the deposition zone in meters.

It may be stated also that n is the global refractive index of the coating obtained and e its thickness in nanometers.

All these data in each of the examples are summarized in the table below:

| Ex. | Q(SiH$_4$) | Q(N$_2$) | Q(C$_2$H$_4$) | L | v | n | e |
|---|---|---|---|---|---|---|---|
| 1 | 4 | 16 | 28 | 0.4 | 0.2 | 1.59 | 70 |
| 2 | 6 | 24 | 42 | 0.4 | 0.2 | 1.68 | 82 |
| 3 | 8 | 32 | 56 | 0.4 | 0.2 | 1.78 | 85 |
| 4 | 12 | 48 | 84 | 0.4 | 0.2 | 1.87 | 90 |
| 5 | 12 | 48 | 84 | 0.2 | 0.2 | 1.92 | 45 |
| 6 | 12 | 48 | 84 | 0.2 | 0.1 | 1.85 | 92 |
| 7 | 4 | 16 | 28 | 0.2 | 0.1 | 1.61 | 74 |

In Examples 1 to 4 and 6 to 7, the ratio 2 has been chosen between the length L in meters and the velocity of the glass ribbon in meters per second. Length L is definitely greater than that which was previously used by taking into account the diffusion of the silane and of the ethylene compound, a calculation which will be given briefly. The time $t_1$ for flow of the gas along this horizontal chamber 36 must be greater than the time $t_2$ necessary for the precursor gases to diffuse over the entire height h of said chamber from the face 38 to the surface of the glass ribbon 10, considering the flow velocity V of the gas stream, the height H and the mean diffusion coefficient $\alpha$. Thus, we have: $t_2 = h^2/\pi x$; $t_1 = L/V$, and we then obtain the following relationship: $L > Vh^2/(\pi x)$.

A comparison of Examples 4 and 5 clearly shows that, even by increasing considerably the flow volumes of precursor gases the thickness of the coating obtained is not necessarily increased in the same proportion and that there is therefore another phenomenon which comes into play.

The nozzle length of 0.4 meters (Example 4), an unusually large length, however, enables the thickness of the coating to be increased considerably up to 90 nm. It is therefore through a longer contact time, and not a larger quantity of precursor gases, that such a result has been achieved.

Similarly, for equal gas flow volumes, Examples 4, 5 and 6 demonstrate that to adapt the length L as a function of the speed of the glass ribbon enables the thickness of the coating to be controlled and increased. From this follows, moreover, another substantial advantage of the invention: by modulating this length L it is possible to obtain the coatings desired with more moderate volumetric flow rates of gaseous products and, consequently, at lesser cost.

It should be noted that in these examples the global refractive index of the coatings obtained lies between 1.59 and 1.92, which constitutes a range of indices especially suitable for an appropriate thickness of the coating, to create interferential phenomena for minimizing iridescence and/or to reduce the colored aspect of a substrate later coated with a second functional film, such as a film based upon metallic oxide.

More generally, this type of coating, used as an underlying film in a stack of thin films on a glass substrate, enables the appearance of the colored reflection of the thus coated substrate to be regulated.

This is why this type of substrate, provided with the coating obtained by the technique of this invention, can be advantageously used in different types of glazings, whether they are single, laminated or multiple, these glazings possessing notably, antisolar properties.

This latter point will be illustrated by the comparative Examples 8 and 9 below.

EXAMPLES 8 AND 9

Example 8 relates to a substrate provided with a coating in the form of an underlying film in accordance with Example 2, said coating therefore having a refractive index of 1.68 and a thickness of 82 nm, onto which there is deposited in a known manner and notably also by on-line pyrolysis, a second film having a solar protection function based upon tin oxide doped with fluorine $SnO_2$:F, this second film having a thickness of approximately 360 nm.

Example 9 is similar to Example 8, except that it does not include the coating of an underlying film according to this invention. It serves as a reference example.

The photometric data of the substrates coated according to these two examples are summarized in the table below. It should be stated that these values are given an a function of the illuminant $D_{65}$, that the light transmission is given in percentages ($T_L$), as also the energy transmission ($T_E$), the reflection on the coated side ($R_L$), and the purity of excitation corresponding to this reflection (pe). Also indicated are the dominant wavelength of this same reflection ($\lambda_a$) in nanometers, and the emissivity ($\epsilon$) of the substrates.

|  | $T_L$ | $T_E$ | $R_L$ | pe | $\lambda_a$ | $\epsilon$ |
|---|---|---|---|---|---|---|
| Example 8 | 79 | 72 | 14 | 12 | 539 | 0.17 |
| Example 9 | 82 | 72 | 11 | 4 | 510 | 0.17 |

It is clearly apparent from this table that the presence of the underlying film enables the value of the purity of excitation in reflection on the film side to be decreased by a factor of 3. A particularly effective trend is therefore obtained as a neutrality in reflection for the assembly comprising substrate-thin films.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A pyrolytic method for forming an interferential coating based on silicon, oxygen and carbon, and having a refractive index of between 1.45 and 2 and a thickness of at least 70 nm, on a float glass ribbon substrate, comprising the steps of:

contacting a moving glass ribbon substrate in a float bath with a precursor gaseous mixture including a silane and an ethylenic compound, said mixture excluding an oxidizing component; and maintaining the moving glass substrate in contact with the precursor gaseous mixture for a contact time period, wherein said contact time period is greater than a time period necessary for the deposition onto the substrate of a gaseous mixture which is identical to said precursor gaseous mixture but includes an oxidizing agent, wherein the contact time agent is controlled by controlling the length L of a deposition zone over which the precursor gaseous mixture flows in contact with the substrate, and wherein length L of the deposition zone, expressed in meters, is at least equal to 1.5 times the velocity of the glass substrate, expressed in meters per second.

2. The method of claim 1 wherein the contact time period is controlled by controlling the velocity of the moving glass substrate.

3. The method of claim 1 wherein for obtaining a coating with a thickness lying between 50 and 90 nm, a contact time between the precursor gas and the substrate corresponds to a deposition zone length of L between 0.2 and 0.4 meters for a glass substrate velocity between 0.1 and 0.2 meters per second.

4. The method of claim 1 wherein the contacting and maintaining steps are performed inside a float glass bath enclosure and above the glass substrate at a temperature of approximately 700° C.

5. The method of claim 1 wherein the silane is monosilane $SiH_4$.

6. The method of claim 5 wherein the ethylenic compound is ethylene $C_2H_4$.

7. The method of claim 6 wherein the ratio of the volumetric flow rate of the ethylene to that of the monosilane lies between 4 and 10.

* * * * *